United States Patent
Jeung et al.

(10) Patent No.: US 8,629,054 B2
(45) Date of Patent: Jan. 14, 2014

(54) PACKAGED SEMICONDUCTOR ASSEMBLIES AND METHODS FOR MANUFACTURING SUCH ASSEMBLIES

(75) Inventors: Boon Suan Jeung, Singapore (SG); Eng Meow Koon, Singapore (SG); Chia Yong Poo, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/441,533

(22) Filed: Apr. 6, 2012

(65) Prior Publication Data

US 2012/0241982 A1 Sep. 27, 2012

Related U.S. Application Data

(62) Division of application No. 12/973,607, filed on Dec. 20, 2010, now Pat. No. 8,232,657, which is a division of application No. 11/846,928, filed on Aug. 29, 2007, now Pat. No. 7,855,462.

(30) Foreign Application Priority Data

Jul. 9, 2007 (SG) ................ 200705093-3

(51) Int. Cl.
*H01L 21/44* (2006.01)
(52) U.S. Cl.
USPC ........................................... 438/617
(58) Field of Classification Search
USPC ........................................... 438/617
See application file for complete search history.

(56) References Cited

U.S. PATENT DOCUMENTS

| | | |
|---|---|---|
| 5,478,781 A | 12/1995 | Bertin et al. |
| 5,786,237 A | 7/1998 | Cockerill et al. |
| 6,043,109 A | 3/2000 | Yang et al. |
| 6,117,704 A | 9/2000 | Yamaguchi et al. |
| 6,124,149 A | 9/2000 | Paik et al. |
| 6,211,461 B1 * | 4/2001 | Park et al. ............. 174/527 |
| 6,222,259 B1 | 4/2001 | Park et al. |
| 6,284,353 B1 | 9/2001 | Takada et al. |
| 6,344,401 B1 | 2/2002 | Lam |
| 6,379,982 B1 | 4/2002 | Ahn et al. |

(Continued)

FOREIGN PATENT DOCUMENTS

| | | |
|---|---|---|
| TW | I239576 B | 11/2005 |
| WO | 2005008724 A2 | 1/2005 |
| WO | 2006023835 A2 | 3/2006 |
| WO | 2006053277 A2 | 5/2006 |

OTHER PUBLICATIONS

Office Action issued Aug. 21, 2012 in Taiwan Application No. 097125926, 20 pages.

(Continued)

*Primary Examiner* — Jenny L Wagner
(74) *Attorney, Agent, or Firm* — Perkins Coie LLP

(57) ABSTRACT

Packaged semiconductor assemblies including interconnect structures and methods for forming such interconnect structures are disclosed herein. One embodiment of a packaged semiconductor assembly includes a support member having a first bond-site and a die carried by the support member having a second bond-site. An interconnect structure is connected between the first and second bond-sites and includes a wire that is coupled to at least one of the first and second bond-sites. The interconnect structure also includes a third bond-site coupled to the wire between the first and second bond-sites.

13 Claims, 18 Drawing Sheets

(56) References Cited

U.S. PATENT DOCUMENTS

| | | |
|---|---|---|
| 6,380,629 B1 | 4/2002 | Kim |
| 6,582,992 B2 | 6/2003 | Poo et al. |
| 6,607,938 B2 | 8/2003 | Kwon et al. |
| 6,833,613 B1 | 12/2004 | Akram et al. |
| 6,841,418 B2 * | 1/2005 | Jeung et al. ............... 438/108 |
| 6,891,273 B2 * | 5/2005 | Pu et al. ..................... 257/780 |
| 7,151,009 B2 | 12/2006 | Kim et al. |
| 7,208,825 B2 | 4/2007 | Pu et al. |
| 7,259,451 B2 | 8/2007 | Seng et al. |
| 7,446,307 B2 | 11/2008 | Huang et al. |
| 7,868,462 B2 | 1/2011 | Choi et al. |
| 2003/0116861 A1 | 6/2003 | Jeung et al. |
| 2003/0230796 A1 | 12/2003 | Ismail et al. |
| 2003/0230801 A1 | 12/2003 | Jiang et al. |
| 2004/0124509 A1 | 7/2004 | Kim et al. |
| 2004/0124523 A1 | 7/2004 | Poo et al. |
| 2004/0157365 A1 | 8/2004 | Koh |
| 2005/0046000 A1 | 3/2005 | Seng et al. |
| 2005/0052830 A1 | 3/2005 | Bauer et al. |
| 2005/0230802 A1 | 10/2005 | Vindasius et al. |
| 2005/0242422 A1 | 11/2005 | Klein et al. |
| 2006/0012018 A1 | 1/2006 | Karnezos et al. |
| 2006/0022324 A1 | 2/2006 | Yu et al. |
| 2006/0084253 A1 | 4/2006 | Mizukoshi et al. |
| 2006/0115932 A1 | 6/2006 | Farnworth et al. |
| 2007/0181989 A1 * | 8/2007 | Corisis et al. ............... 257/686 |
| 2009/0014858 A1 | 1/2009 | Boon et al. |
| 2011/0084402 A1 | 4/2011 | Jeung et al. |

OTHER PUBLICATIONS

Chylak, B. et al., "Packaging Challenges and Solutions for Multi-Stack Die Applications," SEMICON West 2002, SEMI Technology Symposium: International Electrnoics Manufacturing Technology (IEMT) Symposium, IEEE, 7 pages.

International Search Report and Written Opinion issued Jan. 19, 2009 in International Application No. PCT/US2008/069224.

Kada, M. et al., "Advancements in Stacked Chip Scale Packaging (S-CSP), Provides System-in-a-Package Functionality for Wireless and Handheld Applications," Proceedings of Pan Pacific Microelectronics Symopsium, pp. 1-7, Jan. 2000.

Knickerbocker, J.U. et al., "An advanced miltichip module (MCM) for high-performance UNIX servers," IBM J. Res. & Dev., vol. 46, No. 6, pp. 779-804, Nov. 2002.

LU, J.-Q. et al., "Stacked chip-to-chip interconnections using wafer bonding technology with dielectric bonding glues," Proceedings of the IEEE 2001 Interconnect Technology Conference, pp. 219-221, 2001.

Margolin, P., "Low cost army micromodule program," Radio Corporation of America, Quarterly Report No. 2, Dec. 31, 1963, Accession No. AD0439238. Defence Technical Information Center. Retrieved from the Internet <URL: http://handle.dtic.mil/100.2/AD439238>, Feb. 3, 2009.

Savastiouk, S. et al., "3-D Stacked Wafer-Level Packaging," Advanced Packaging, vol. 9, No. 3, Mar. 2000, abstract.

Schaper, L.W., "Architectural Implications and Process Development of 3-D VLSI$Z$-Axis Interconnects Using Through Silicon Vias," IEEE Transactions on Advanced Packaging, vol. 28, Issue 3, pp. 356-366, Aug. 2005, abstract.

Search Report and Written Opinion issued Mar. 9, 2009 in Singapore Application No. 200705093-3.

Yamazaki, T. et al., "Real Chip Size 3-Dimensional-Stacked Package," NEC Research & Development, 2003, vol. 44, No. 3, pp. 235-240.

* cited by examiner

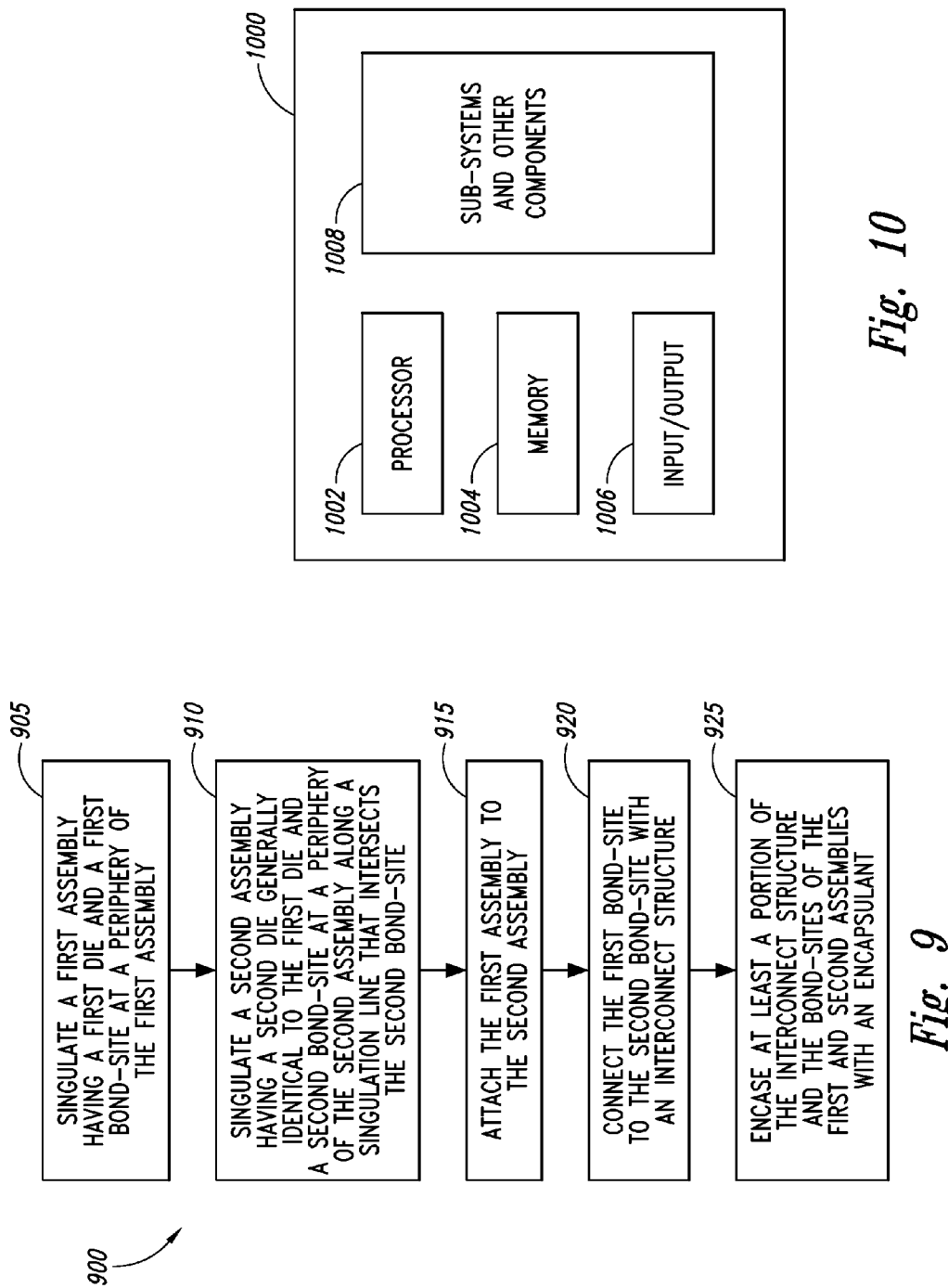

PACKAGED SEMICONDUCTOR ASSEMBLIES AND METHODS FOR MANUFACTURING SUCH ASSEMBLIES

CROSS-REFERENCE TO RELATED APPLICATIONS

This application is a divisional of U.S. application Ser. No. 12/973,607 filed Dec. 20, 2010, now U.S. Pat. No. 8,232,657, which is a divisional of U.S. application Ser. No. 11/846,928 filed Aug. 29, 2007, now U.S. Pat. No. 7,855,462, which claims foreign priority benefits of Singapore Application No. 200705093-3 filed Jul. 9, 2007, now Singapore Patent No. 148901, each of which is incorporated herein by reference in its entirety.

TECHNICAL FIELD

The present disclosure relates to interconnect structures for packaged semiconductor assemblies, including stacked semiconductor assemblies, and associated methods for manufacturing such assemblies.

BACKGROUND

Semiconductor processing and packaging techniques are continually evolving to meet industry demands for improved performance and reduced size and cost. Electronic products require packaged semiconductor assemblies with a high density of devices in a relatively small space. For example, the space available for memory devices, processors, displays and other microfeature devices is continually decreasing in cell phones, personal digital assistants, laptop computers and many other products. Accordingly, a need exists to increase the density of semiconductor devices and components within the confined footprint of the semiconductor assembly. One technique to increase the density of semiconductor devices within a given footprint is to stack packaged semiconductor devices. A challenge with this technique, however, is providing adequate electrical interconnects within and between the stacked packages.

Conventional interconnects electrically connect the integrated circuitry of a semiconductor device (such as a die) with other devices. For example, wire bonds and stud bumps can be used to electrically connect semiconductor devices to a lead frame and/or a support substrate. Interconnects within a device or package can also be formed by creating a via in the device and then filling or plugging the via with conductive material. FIG. 1 illustrates an existing interconnect 100 including a filled via 110. The via 110 is formed by drilling or etching a hole through a silicon wafer 112. The interconnect 100 is then formed by depositing a conductive layer 114 in and around the via 110, and patterning the conductive layer 114 external to the via 110 to isolate the conductive layer 114 and provide an appropriate electrical signal route. The remaining void in the via 110 is filled with a conductive fill material 116. The conductive layer 114 and the conductive fill material 116 electrically connect a pad 117 at a first side of the package with a solder ball 118 (or other conductive feature) at a second side of the package.

One challenge associated with forming the interconnect 100 illustrated in FIG. 1 is that it may be difficult to achieve uniform metallization in the via. If the metallization within the via is non-uniform, the quality and integrity of the interconnect can decrease. For example, vias having a high aspect ratio (i.e., ratio of the depth to the width of the opening) are especially difficult to consistently plate and fill. Moreover, in certain circumstances the filling process can trap air in the via that can cause the interconnect or assembly to crack as the fill material and the assembly harden. Such non-uniformities in the metallization of the via can result in inconsistent electrical connections and compromise the integrity of the interconnects.

Other challenges associated with existing interconnects are the cost, time and complexity of forming, plating and filling the vias. Forming the vias by an ablation or drilling process typically requires forming individual vias in a sequential manner, which increases the processing time required to form the vias. Simultaneously forming the vias by an etching process can be much faster, but etching can result in vias having inconsistent sizes. It can also be difficult to achieve a dense distribution of the vias with an etching process. Moreover, the plating and filling steps following the via formation require additional processing time. Accordingly, a need exists to improve interconnects and processes for forming interconnects in packaged semiconductor devices and assemblies.

BRIEF DESCRIPTION OF THE DRAWINGS

FIG. 9 is a flow diagram of a process for forming a semiconductor assembly in accordance with an embodiment of the invention.

FIG. 10 is a schematic illustration of a system that incorporates interconnect structures in accordance with embodiments of the invention.

DETAILED DESCRIPTION

Several embodiments are described below with reference to packaged semiconductor devices and assemblies, and methods of forming packaged semiconductor devices and assemblies. Many details of the invention are described below with reference to methods of forming devices and assemblies having interconnect structures within and between them. The term "semiconductor device" and "semiconductor assembly" are used throughout to include a variety of articles of manufacture, including for example, semiconductor wafers having active components, individual integrated circuit dies, packaged dies, and two or more semiconductor devices or assemblies in a stacked configuration. Many specific details of certain embodiments are set forth in FIGS. 2A-10 and the following text to provide a thorough understanding of these embodiments. Several other embodiments of the invention can have different configurations, components and/or processes than those described in this section. A person skilled in the art, therefore, will appreciate that the invention may have additional embodiments and may be practiced without several details of the embodiments shown in FIGS. 2A-10.

Figure 1:
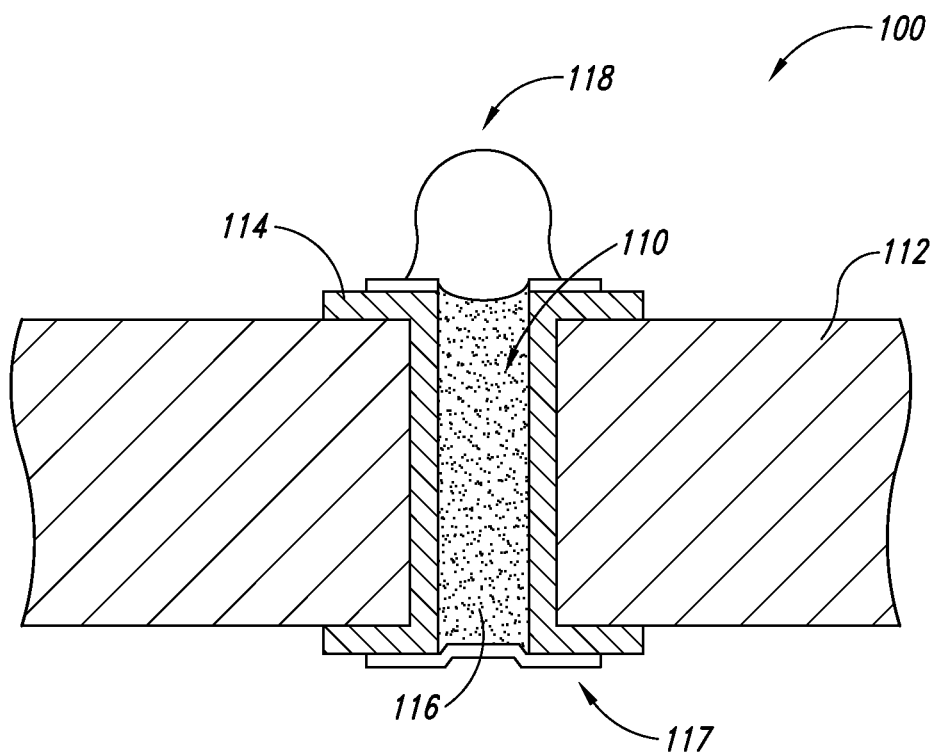
FIG. 1 is a side cross-sectional view of a portion of an interconnect in accordance with the prior art.
Figure 2A:
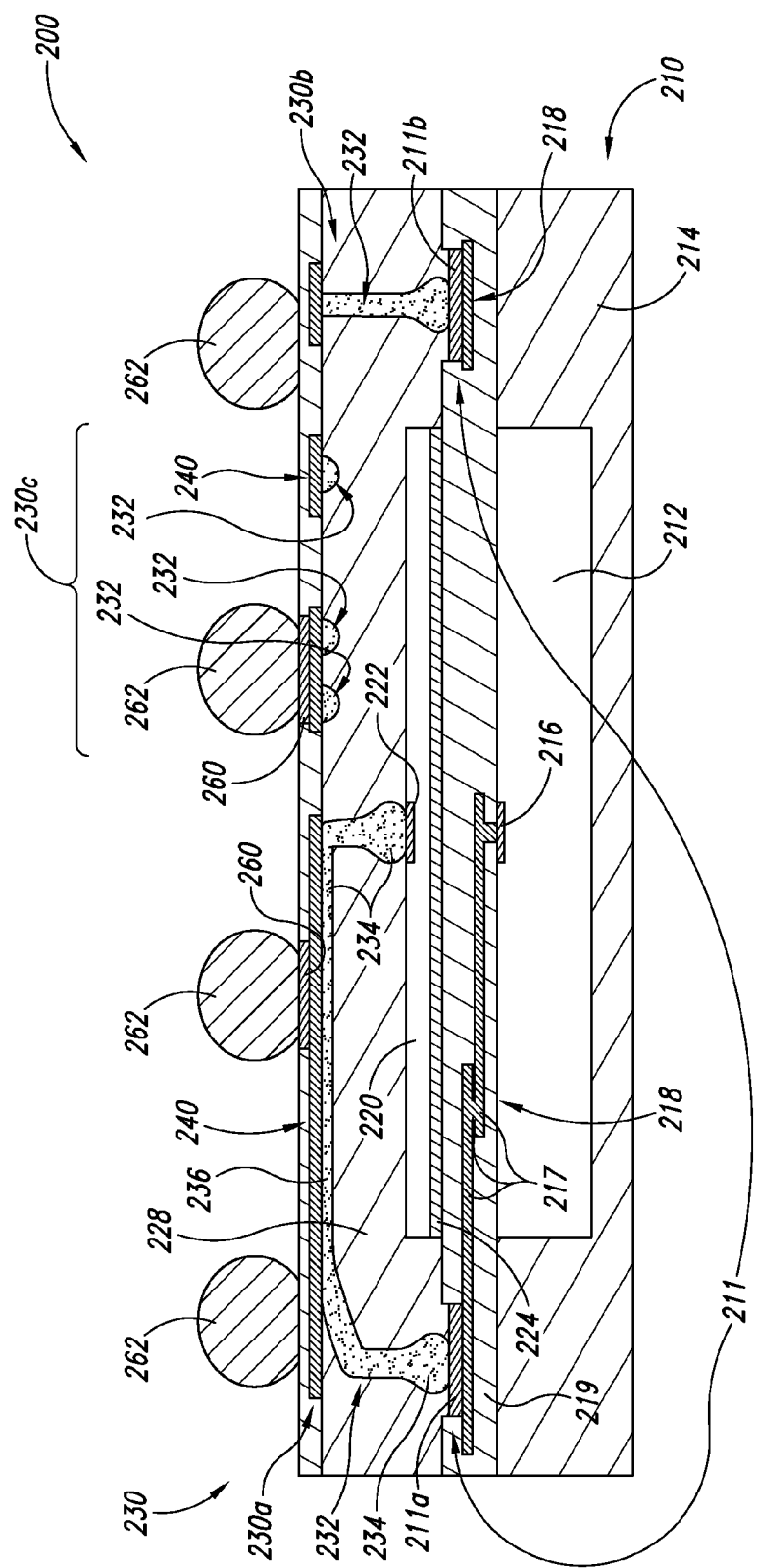
FIG. 2A is a side cross-sectional view of a semiconductor assembly in accordance with an embodiment of the invention.

FIG. 2A is a cross-sectional view of a semiconductor assembly 200 in accordance with a particular embodiment. The assembly 200 includes a support member 210 having one or more first bond-sites 211 (e.g., first bond-sites 211a and 211b shown in FIG. 2A). The support member 210 carries a die 220 that can include any of a variety of semiconductor devices having a desired configuration. For example, the die 220 can include a dynamic or static random access memory, a flash memory, a microprocessor, or an application-specific integrated circuit. The die 220 has one or more second bond-sites 222, only one of which is visible in FIG. 2A. An adhesive layer 224 or other structure attaches the die 220 to the support member 210. One or more interconnect structures 230 (e.g., first, second and third interconnect structures 230a, 230b and 230c shown in FIG. 2A) electrically connect corresponding first bond-sites 211 to corresponding second bond-sites 222. The interconnect structures 230 can include a wire 232, a redistribution structure 240 and one or more third bond-sites 260 at a surface of the assembly 200.

For the purposes of this disclosure, a wire refers generally to a pre-formed conductive element that is attached to and/or between bond-sites, as opposed to redistribution layer lines and vias that are formed in-situ, e.g., using deposition techniques. The wire, for example, can include a wire bond or a stud bump. Wire bonds and stud bumps can be formed using wire bonding techniques including, but not limited to, forming a ball-like structure at the end of the wire and attaching the end of the wire to a bond-site, e.g., by applying heat, mechanical force and/or ultrasonic energy. When forming wire bonds, the wire can be looped and attached to another bond-site, and when forming stud bumps, the wire can be cut or broken after attachment to a single bond-site. One skilled in the art will appreciate that different techniques can be used for forming the wire bonds. For example, in certain embodiments stand-off stitch bonding techniques (as used by Kulicke and Soffa Industries, Inc., Willow Grove, Pa.) can be useful for bond-sites having a limited size. In addition, the order in which the bond-sites are connected can differ. For example, the wire bond can be attached to the first bond-sites 211 first, and then to the second bond-sites 222, or vice versa.

The assembly 200 illustrated in FIG. 2A further includes an encapsulant 228 disposed at least partially over and/or around the support member 210, the die 220 and the interconnect structures 230 to protect these components. As explained in more detail below, the interconnect structures 230 can provide high quality interconnections between the components of the assembly 200 and can be formed with simpler processing steps than those associated with existing interconnects.

In the embodiment illustrated in FIG. 2A, a representative first interconnect structure 230a includes a wire 232 that is attached between the first bond-site 211a and the second bond-site 222. In this embodiment, the wire 232 is a single, continuous wire bond 234 that has been looped between the first bond-site 211a and the corresponding second bond-site 222. As such, the wire 232 provides a uniform electrical connection between the support member 210 and the die 220 without requiring the complex process of forming, plating and filling the vias typically used for conventional interconnects. Instead of forming and filling vias, the wire 232 connects the bond-sites (or other desired components) before the attached die 220 is encapsulated. The wire 232 is generally composed of a conductive material, such as nickel, copper, gold, silver, platinum, alloys of these metals, and/or any other conductive material suitable for wire bonding techniques. The characteristics of the wire 232 can be selected based on device-specific processing or performance needs. For example, the wire 232 can have a diameter, geometry (e.g., round cross-section or flat cross-section), and/or modulus of elasticity selected to satisfy performance and integration requirements.

The first interconnect structure 230a illustrated in FIG. 2A also includes an intermediate segment 236 of the wire bond 234, which is connected to the redistribution structure 240. The intermediate segment 236 is spaced apart from and generally parallel to the die 220. As such, the intermediate segment 236 provides an elongated section aligned along the major axis of the wire 232 for connecting with the redistribution structure 240. This arrangement can enhance the integrity of the connection with the redistribution structure 240. The redistribution structure 240 can be used to position corresponding third bond-sites 260 relative to the first bond-site 211a and the second bond-site 222. A conductive member 262, such as a solder ball, can be coupled to the third bond-site 260 to provide electrical connections to devices external to the assembly 200. In certain embodiments, the first interconnect structure 230a does not include a redistribution structure 240, but rather the third bond-sites 260 can be attached directly to a portion of the wire bond 234 between the first bond-site 211a and the second bond-site 222.

The assembly 200 can include other interconnect structures 230 (e.g., the second interconnect structure 230b and a multiple third interconnect structures 230c shown in FIG. 2A) having features generally similar to those of the representative first interconnect structure 230a described above. For example, the second interconnect structure 230b shown toward the right side of FIG. 2A can include a wire 232 connected between a corresponding first bond-site 211b and a corresponding second bond-site of the die 220 that is out of the plane of FIG. 2A and not visible. The third interconnect structures 230c shown adjacent to the second interconnect structure 230b also include wires 232 (cross-sectional portions of which are visible in FIG. 2A) that extend transverse to the plane of FIG. 2A, and are attached between corresponding first bond-sites and second bond-sites that are not visible in FIG. 2A. These interconnect structures 230b and 230c can also include corresponding redistribution structures 240 that are coupled between intermediate segments of the wires 232 and corresponding third bond-sites 260.

In the embodiment illustrated in FIG. 2A, the support member 210 includes a prepackaged die 212. The die 212 can be a known good die that has been tested prior to being packaged in a die encapsulant 214. The die 212 can include multiple die bond-sites 216, a representative one of which is shown in FIG. 2A connected to the first bond-site 211a with a die redistribution structure 218. Other redistribution structures (not visible in FIG. 2A) can connect the die 212 to other first bond-sites, e.g., the first bond-site 211b toward the right side of FIG. 2A. The die redistribution structure 218 typically includes conductive lines and vias 217, along with one or more dielectric layers 219, and connects the die bond-site 216 with the first bond-site 211 using known deposition and patterning techniques. In other embodiments described below, the support member 210 can include other semiconductor devices or components, such as a bare die or a layered substrate (e.g., a printed circuit board).

The assembly 200 and the interconnect structures 230 have been completely formed in the embodiment illustrated in FIG. 2A. FIGS. 2B-2E described below illustrate techniques for forming the assembly 200 shown in FIG. 2A. FIGS. 3-10 illustrate other semiconductor assemblies, methods for forming semiconductor assemblies, and a representative system in accordance with several embodiments. Like reference characters refer generally to like components in FIGS. 2A-10 and thus the description of many of these components will not be repeated with respect to FIGS. 2B-10.

Figure 2B:
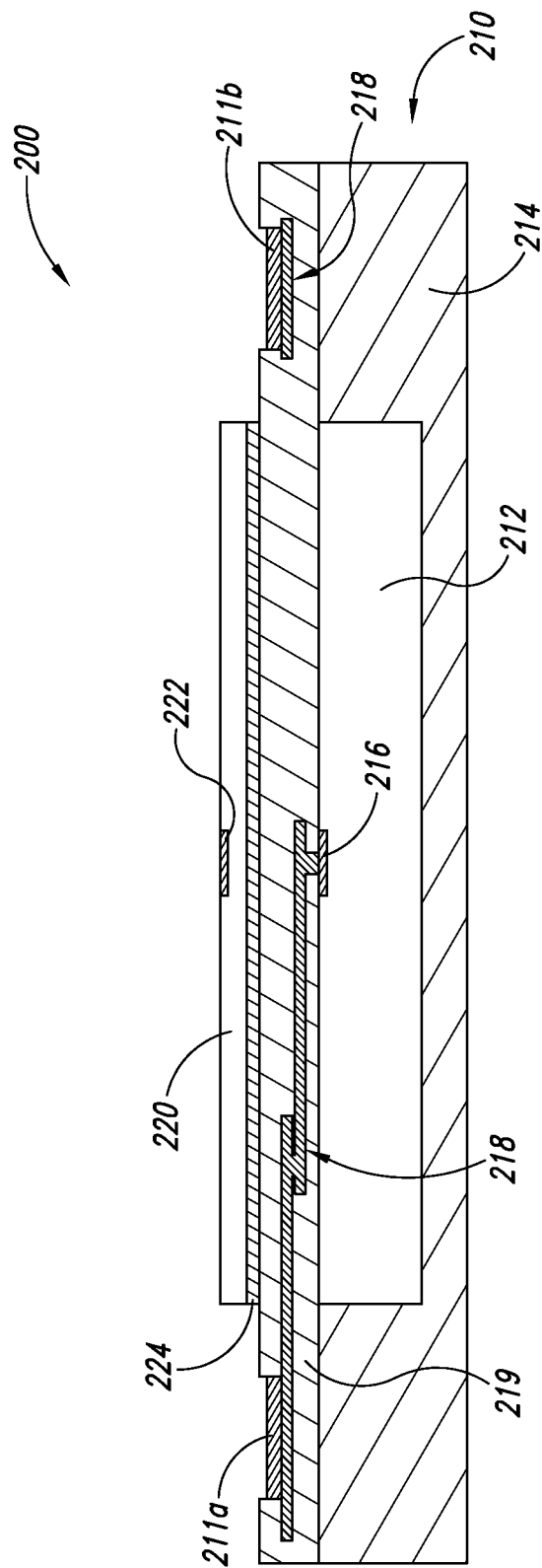
FIGS. 2B-2E are side cross-sectional views illustrating various stages in a method of forming semiconductor assemblies in accordance with an embodiment of the invention.

FIG. 2B illustrates a stage at which the die 220 has been attached to the support member 210 with the adhesive layer 224. The adhesive layer 224 can be applied to the support member 210 and/or the die 220, and can include any of a variety of suitable tapes, polymers or other structures, as is known in the art.

Figure 2C:
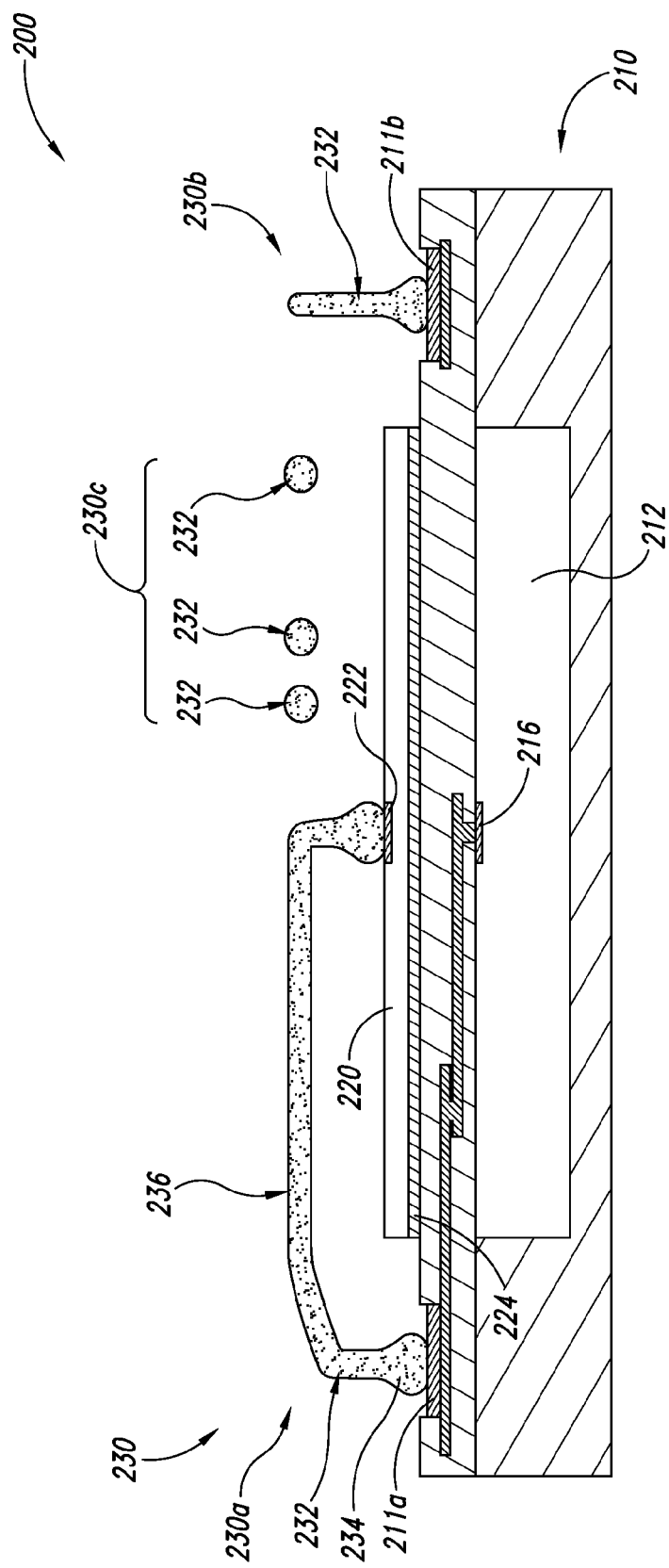

In FIG. 2C, the wires 232 of the interconnect structures 230 are connected to the first bond-sites 211a, 211b (as well as other first bond-sites not visible in FIG. 2C), and to the second bond-sites 222 (one of which is shown in FIG. 2C). For example, the wire 232 of the first interconnect structure 230a can be a continuous wire bond 234 that is attached between the first bond-site 211a and the second bond-site 222 using existing wire bonding techniques, such as, for example, stand-off stitch bonding. Accordingly, the wire bond 234 can provide a robust connection between the support member 210 and the attached die 220, and can be attached to the first bond-site 211a and the second bond-site 222 relatively quickly. In this configuration, the intermediate segment 236 of the wire bond 234 is spaced apart from and generally parallel to the attached die 220 to facilitate subsequent electrical connections. As discussed further below, in certain embodiments the intermediate segment 236 can be at least partially exposed from the encapsulant 228 and connected to the redistribution structure 240.

Figure 2D:
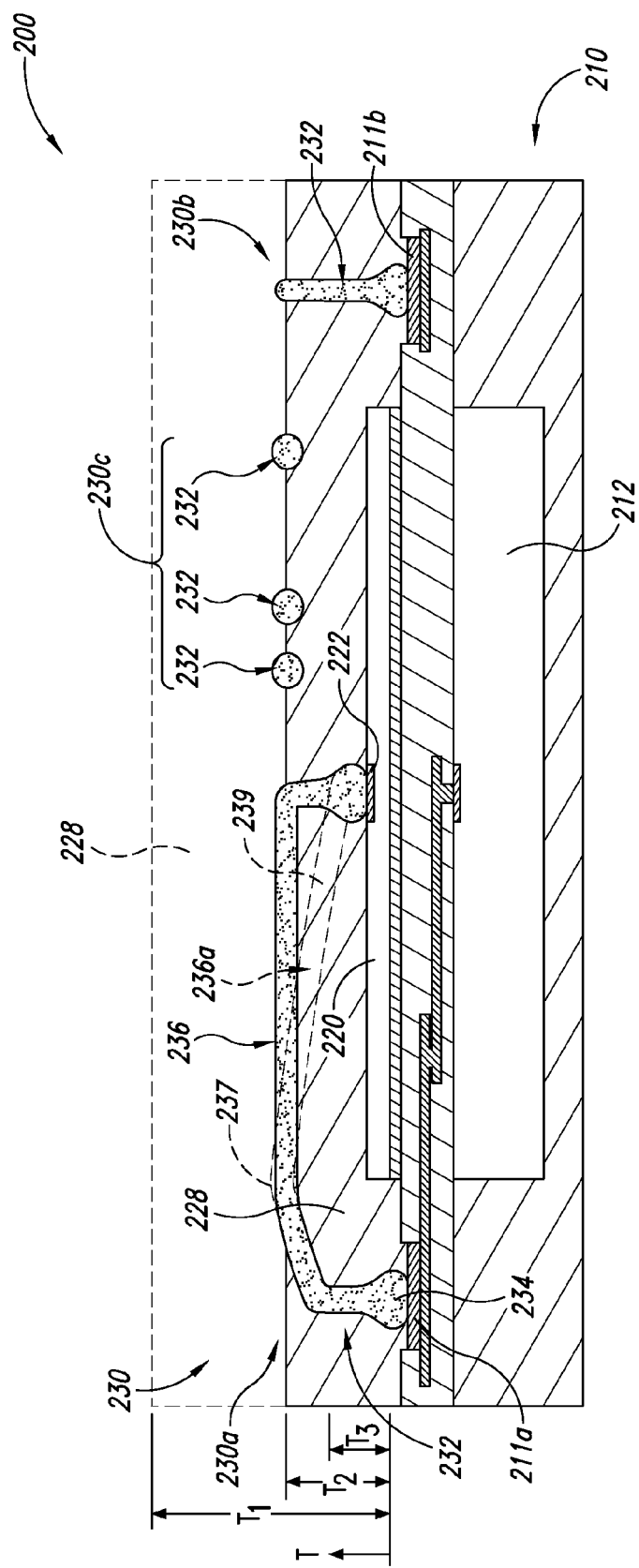

FIG. 2D illustrates a stage at which the encapsulant 228 is disposed over the interconnect structures 230 and the attached die 220, for example in a molding process. The encapsulant 228 protects the attached die 220 from contamination (e.g., due to moisture, particles, etc.) and also electrically isolates the wires 232 and other conductive components of the interconnect structures 230 and the assembly 200. A thickness T of the encapsulant 228 can be controlled to have different values in different embodiments. For example, in certain embodiments, the thickness T can have a first value $T_1$ so as to completely cover the wires 232, including the intermediate segments 236. In other embodiments, the thickness T can have a second value $T_2$ so that the intermediate segments 236 of the wires 232 are at least partially exposed to the region outside of the encapsulant 228. If the thickness T has a value greater than $T_2$ (e.g., $T_1$), then material removal steps can be used to expose the intermediate segments 236. For example, the encapsulant 228 can be planarized and/or etched to at least partially expose the intermediate segments 236. If the intermediate segments 236 remain exposed at the end of the encapsulation process, then the material removal steps may not be required. In certain embodiments, the material removal steps can remove the encapsulant 228 to a thickness having a third value $T_3$, such that the intermediate segments 236 have been removed and each wire 232 is no longer continuous between the first bond-sites 211 and the second bond-sites 222. In any of these embodiments, a subsequently-disposed redistribution structure is electrically connected to the exposed portions of the wires 232. FIG. 2D also illustrates another configuration of the wire bond 234 (shown in broken lines) that can include an intermediate segment 236a having a first portion 237 that projects from or is accessible through the encapsulant 228, and a second portion 239 that generally slopes towards the second bond-site 222. In this embodiment, the first portion 237 provides an access location for a bond-site that can be attached directly to the intermediate portion 236a of the wire bond 234 without a redistribution structure.

Figure 2E:
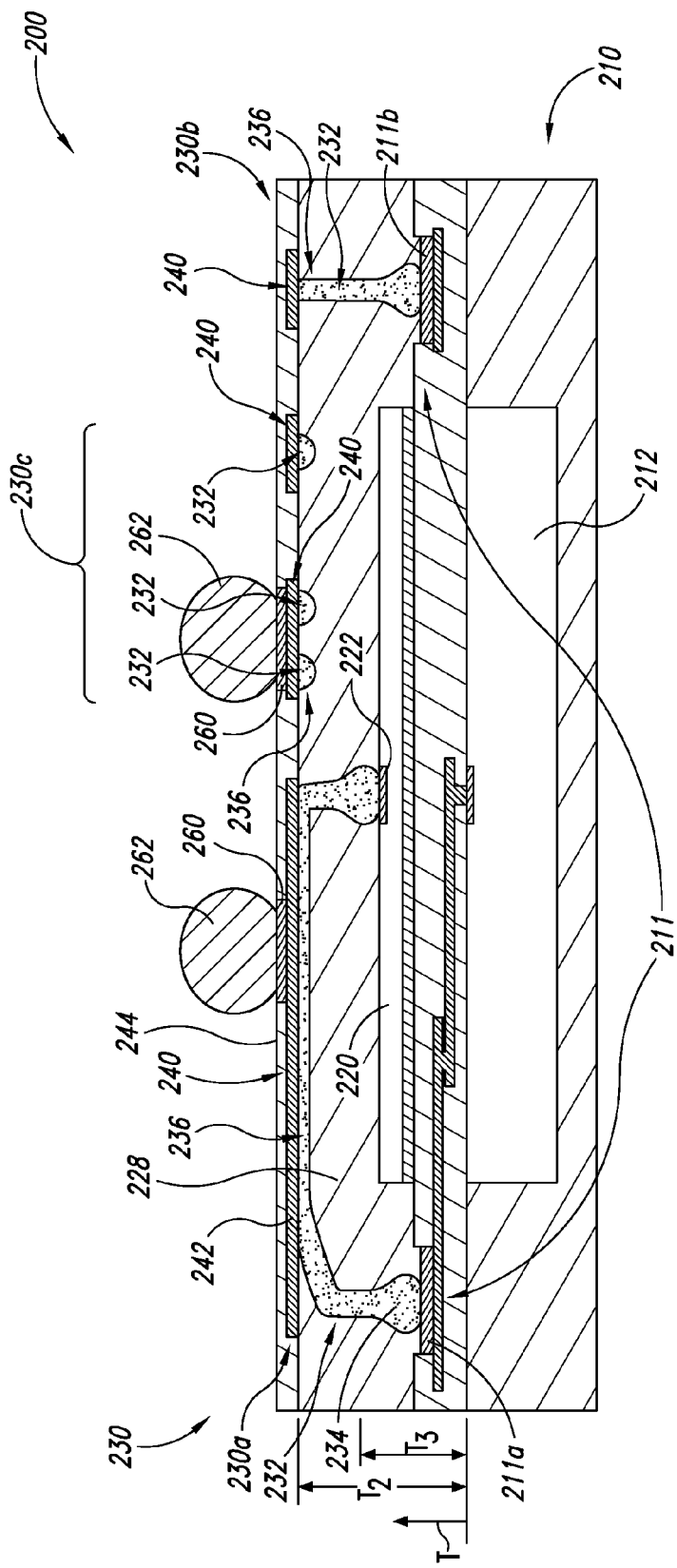

FIG. 2E illustrates a stage at which the redistribution structure 240 is formed at an exposed face of the encapsulant 228, and is electrically connected to and forms part of the interconnect structures 230 at the exposed intermediate segments 236. For example, the redistribution structure 240 can include a conductive layer 242 deposited directly on the exposed intermediate segments 236 of the wires 232 (some of which are elongated transverse to the plane of FIG. 2E). The intermediate segments 236 can provide an elongated contact area for the conductive layer 242.

In embodiments where the thickness T of the encapsulant 228 has a value less than $T_2$ (e.g., $T_3$), the intermediate segments 236 are removed along with the adjacent encapsulant 228. Accordingly, the redistribution structure 240 is connected to exposed cross-sectional surfaces of the wires 232 that are generally transverse to the longitudinal axes of the wires 232 and spaced apart from the first and second bond-sites 211 and 222. In these embodiments and embodiments described below with reference to FIGS. 3-4B, the interconnect structures 230 have material discontinuities along the electrical path between the first and second bond-sites 211 and 222.

In any of the foregoing embodiments, the redistribution structure 240 can also include a dielectric layer 244 that is disposed on the conductive layer 242 and patterned to expose the portions of the conductive layer 242 that form and/or connect to the third bond-sites 260. The third bond-sites 260 provide electrical connections from the redistribution structure 240 to the conductive members 262, which are in turn accessible from outside the assembly 200. In an embodiment in which the wire bond 234 includes the sloped intermediate segment 236a (illustrated in broken lines in FIG. 2D), the third bond-sites 260 can be formed at and attached directly to the first portion 237 of the wire bonds 234 without the redistribution structure 240. Accordingly, the interconnect structures 230 can provide robust electrical connections between the first and second bond-sites 211 and 222, as well as to the conductive members 262 and external devices that are connectable to the conductive members 262.

Figure 3:
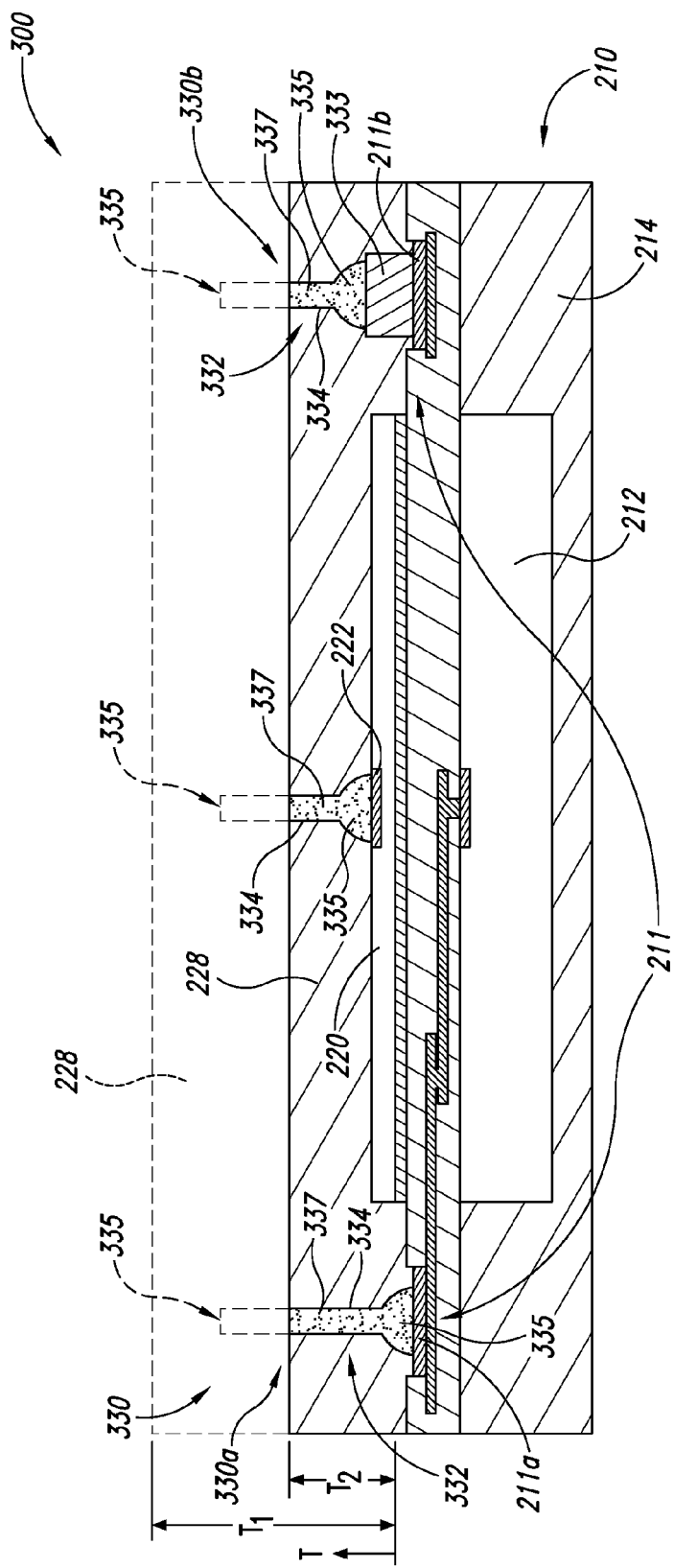
FIGS. 3-4B are side cross-sectional views of semiconductor assemblies in accordance with embodiments of the invention.

FIG. 3 is a cross-sectional view of an assembly 300 configured in accordance with another embodiment. The assembly 300 is generally similar to the assembly 200 described above with respect to FIGS. 2A-2E; however in this embodiment the assembly 300 includes interconnect structures 330 having wires 332 in the form of discrete stud bumps 334 rather than the continuous uninterrupted wire bonds 234 described above. Accordingly, in this embodiment the interconnect structures 330 have material discontinuities spaced apart from and between the first bond-sites 211 and the second bond-sites 222.

FIG. 3 illustrates a processing stage at which individual stud bumps 334 have been coupled to the first bond-sites 211 (shown as first bond-sites 211a and 211b) and the second bond-site 222, and have been at least partially encased with the encapsulant material 228. Individual stud bumps 334 are formed using the wire bonding techniques described above and include a base portion 335 coupled to the corresponding bond-site 211 or 222, and a short wire segment 337 extending from the base portion 335. The stud bumps 334 can be attached directly to the corresponding first bond-site 211 or the corresponding second bond-site 222, or to an intermediate structure, such as a conductive pedestal 333. For example, a representative interconnect structure 330a shown toward the left side of FIG. 3 includes stud bumps 334 that are attached directly to the first bond-site 211a and the second bond-site 222. Another representative interconnect structure 330b shown toward the right side of FIG. 3 includes a stud bump 334 that is coupled to the first bond-site 211b via the conductive pedestal 333. The pedestal 333 can be formed using known patterning and deposition techniques, and can project from the first bond-site 211b to a predetermined height. The pedestal 333 can space the attached wire 332 away from the first bond-site 211b and decrease the length of the wire 332. Decreasing the wire length can reduce or eliminate "wire sweep" or movement of the wire 332 during the encapsulation process. Though not shown in FIG. 3, a similar technique can be used to space the wires 232 described above with reference to FIGS. 2A-2E away from the corresponding bond-sites, and reduce or eliminate wire sweep in a generally similar manner.

As illustrated in FIG. 3, the encapsulant 228 is molded around the stud bumps 334 and the pedestal 333 to protect and electrically isolate these components. The thickness T of the encapsulant 228 can be controlled at the molding stage and/or with material removal steps. For example, the encapsulant 228 can be disposed to completely cover the stud bumps 334 (as illustrated by the first thickness $T_1$), and then a portion of the encapsulant 228 and the stud bumps 335 can be removed (as illustrated by the second thickness $T_2$) to expose the ends of the stud bumps 334. In another embodiment, the stud bumps 334 can extend only to the thickness $T_2$ prior to encapsulation, and the mold cavity can be short enough to prevent the ends of the stud bumps 334 from being encapsulated. In either embodiment, the assembly 300 can then be further processed, for example, by forming a redistribution structure electrically connected to the exposed portions of the stud bumps 334. The redistribution structure can include third bond-sites or other electrical connection sites accessible from the exterior of the assembly 300, using techniques generally similar to those described above with reference to FIGS. 2A-2E.

Figure 4A:
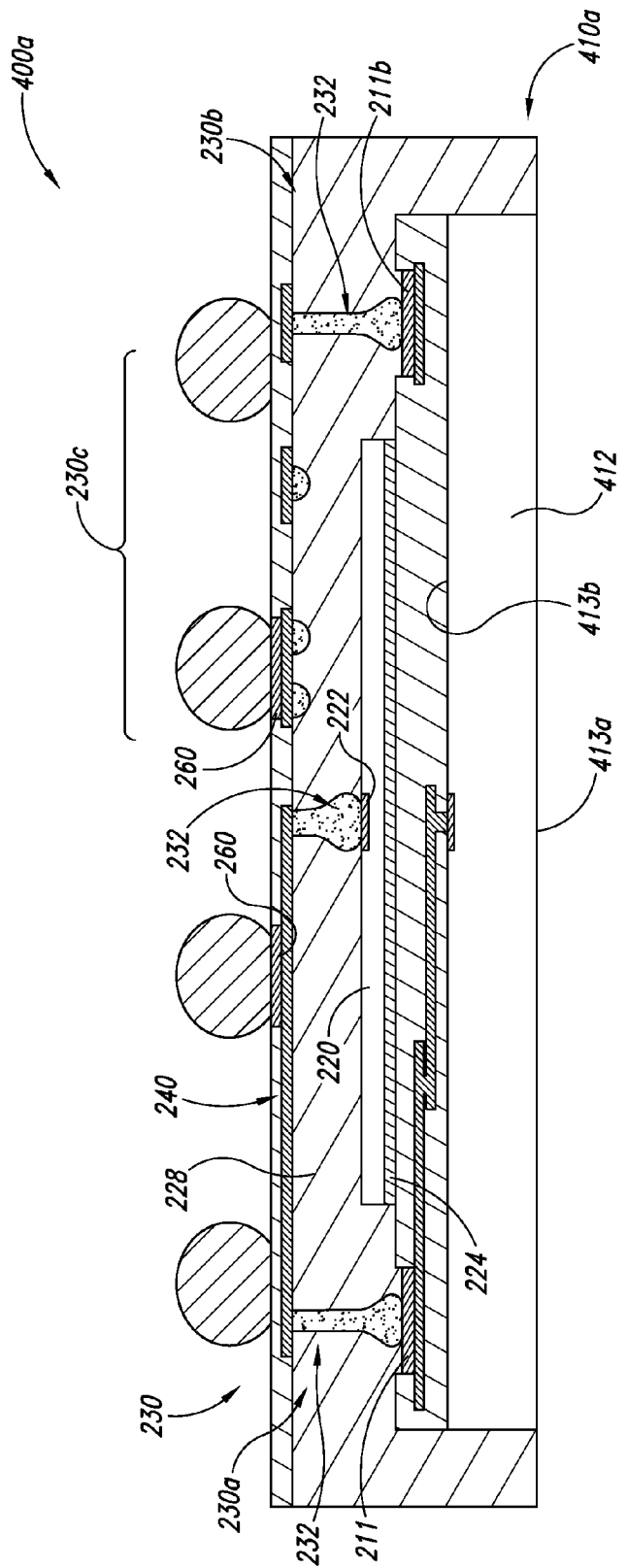
Figure 4B:
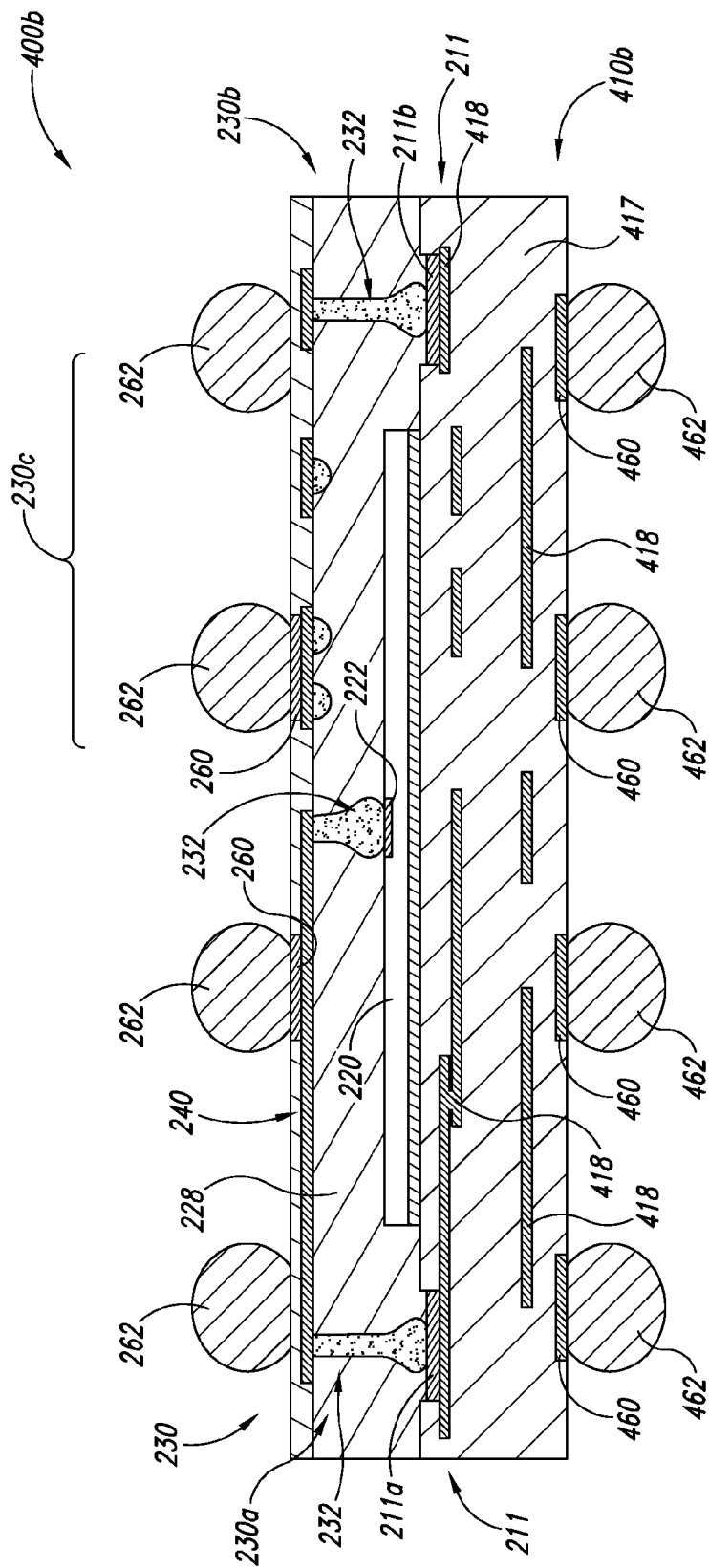

In certain embodiments, the support member 210 of the assemblies 200 and 300 described above can include semiconductor devices other than the prepackaged die 212. FIGS. 4A and 4B, for example, are cross-sectional illustrations of assemblies 400a and 400b respectively, that are generally similar to the assemblies described above (including wires 232 that can be wire bonds or stud bumps), except that the support members of the assemblies 400a and 400b include other devices. Referring first to FIG. 4A, the assembly 400a includes a support member 410a that is a bare (e.g., unpackaged) die 412. As such, the die 412 includes an exposed inactive side 413a opposite an active side 413b. Accordingly, when the assembly is encapsulated, the encapsulant 228 can be disposed over at least a portion of the bare die 412, as well as the interconnect structures 230 and the attached die 220. The inactive side 413a can remain exposed after encapsulation (as shown in FIG. 4A), or it can be covered with the encapsulant 228.

Referring to FIG. 4B, the assembly 400b includes a support member 410b that in turn includes a substrate member 417 (e.g., a printed circuit board), having one or more conductive layers but no active semiconductor devices. The substrate 417 can include a substrate redistribution structure 418 that connects components within and to the substrate 417. For example, the substrate redistribution structure 418 can connect the first bond-sites 211 to substrate bond-sites 460 at a side of the substrate 417 opposite the attached die 220. A plurality of conductive members 462, (e.g., solder balls), can be coupled to the substrate bond-sites 460. Accordingly, the assembly 400b can be arranged in a stack with other assemblies, with the conductive members 262, 462 accessible for electrical connections at both sides of the assembly 400b.

Several embodiments of the interconnect structures described above can provide quality interconnections, consistent electrical properties, and reduced manufacturing time. For example, the interconnect structures that include the wire bonds 234 illustrated in FIGS. 2A-2E can provide a continuous connection between the first bond-sites 211 and the second bond-sites 222. Both the wire bonds 234 and the stud bumps 334 (both of which can include wires 232) illustrated in FIGS. 2A-4B are formed before the corresponding assembly is encapsulated, and can thus form void-free interconnects without the need for forming and plating high aspect ratio vias. Such interconnects can be more robust than the plated and filled vias associated with existing interconnects. Additionally, attaching the wire bonds 234 and the stud bumps 334 to the corresponding bond-sites and disposing the encapsulant 228 over the wire bonds 234 and stud bumps 334 can be a relatively fast and cost effective method of forming the interconnect structures. For example, this process can eliminate the patterning, etching, plating and filling steps associated with forming existing interconnects.

Figure 5:
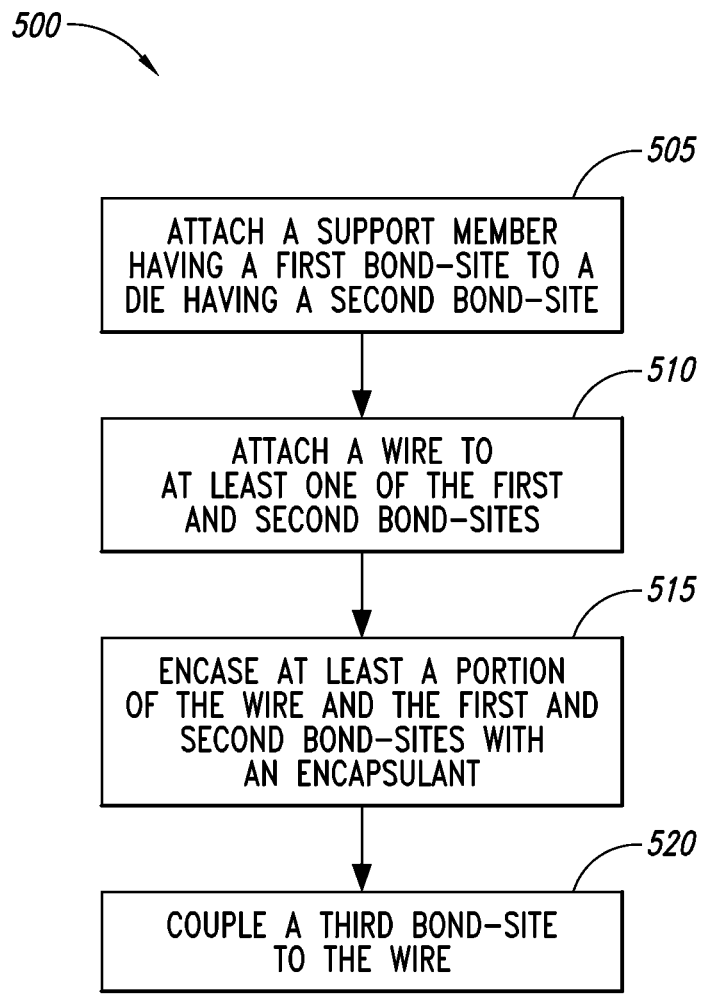
FIG. 5 is a flow diagram of a process for forming a semiconductor assembly in accordance with an embodiment of the invention.

FIG. 5 is a flow diagram illustrating an embodiment of a process 500 for forming a semiconductor assembly. In this embodiment, the process 500 includes attaching a support member having a first bond-site to a die having a second bond-site (block 505). The support member can include a prepackaged die, a bare die, a layered substrate, or other device having conductive and/or semiconductor features. The process further includes attaching a wire to at least one of the first and second bond-sites (block 510). The wire can be a continuous wire bond with opposing ends connected to each of the first and second bond-sites, or the wire can include discrete stud bumps or portions of a wire bond individually disposed at each of the first and second bond-sites. The process further includes encasing at least a portion of the wire and the first and second bond-sites with an encapsulant (block 515). A thickness of the encapsulant can be controlled such that the encapsulant completely covers the wire, or such that a portion or segment of the wire is at least partially exposed from the encapsulant. In certain embodiments, the encapsulant can be partially removed to expose an intermediate segment of the wire at a face of the encapsulant. The intermediate segment of the wire can be aligned along a longitudinal axis of the wire and can be generally parallel to the face of the encapsulant between the first and second bond-sites. In other embodiments, removing the encapsulant exposes ends of the wire that are generally transverse to the longitudinal axis of the wire.

The process 500 further includes coupling a third bond-site to the wire (block 520). In certain embodiments, the process can further include forming a redistribution structure at a face of the encapsulant spaced apart from the die. The redistribution structure can be connected to the intermediate segment of the wire between the first and second bond-sites or to the exposed ends of the wire, and the third bond-site can be connected to the redistribution structure. In other embodiments, the third bond-site can be connected directly to the wire or coupled to the wire with structures other than a redistribution structure.

Figure 6A:
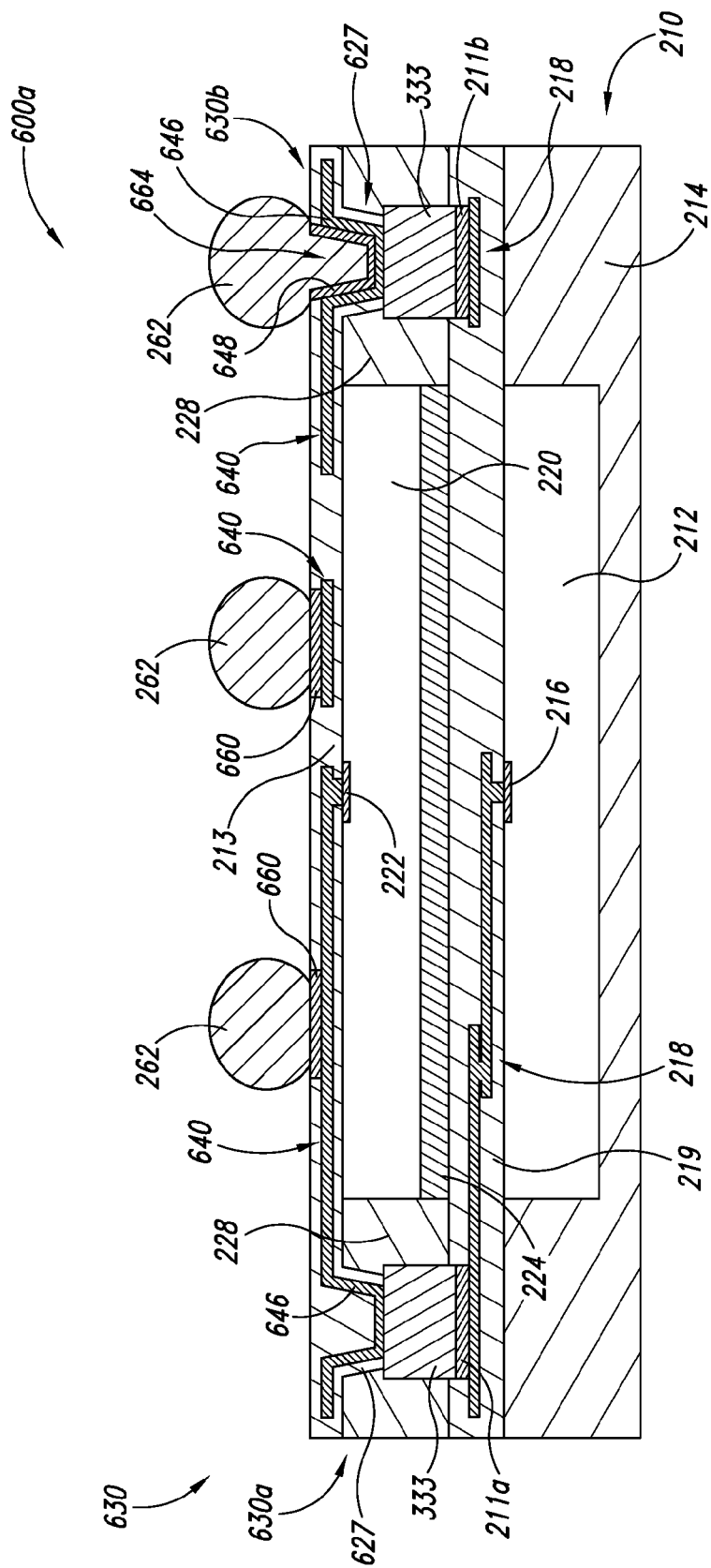
FIG. 6A is a side cross-sectional view of a semiconductor assembly in accordance with an embodiment of the invention.

FIG. 6A is a cross-sectional view of an assembly 600a configured in accordance with another embodiment. Certain aspects of the assembly 600a shown in FIG. 6A are generally similar to the assemblies described above; however in this embodiment, the assembly 600a has interconnect structures 630 that do not include a wire 232 (e.g., a wire bond 234 or stud bump 334, described above) between the first bond-sites 211a, 211b and the second bond-sites 222. Instead, the interconnect structures 630 include conductive pedestals 333 attached to the first bond-sites 211, and a redistribution structure 640, including third bond-sites 660, that directly connects the pedestals 333 to the second bond-sites 222. For example, a representative first interconnect structure 630a includes a redistribution structure 640 directly coupled to the pedestal 333 through a shallow via 627 in the encapsulant 228. Accordingly, the redistribution structure 640 includes a portion 646 that extends into the via 627 and contacts the pedestal 333. The presence of the pedestal 333 reduces the depth and aspect ratio of the via 627 and can therefore improve the manufacturability and reliability of the interconnect structures 630.

A representative second interconnect structure 630b is generally similar to the first interconnect structure 630a; however, the second interconnect structure 630b includes a conductive member 262 (e.g., a solder ball) positioned directly over the corresponding first bond-site 211b. A conductive material 648 (e.g., a thin conductive layer) can be disposed on a portion 646 of the redistribution structure 640 in the shallow via 627 to facilitate the connection with the conductive member 262. A base portion 664 of the conductive member 262 is reflowed and coupled to the conductive material 648, thereby connecting and the conductive member 262 to the first bond-site 211b via the pedestal 333. In this embodiment, the conductive sidewalls of the via 627 can provide additional electrical contact area and structural support for the conductive member 262.

Figure 6B:
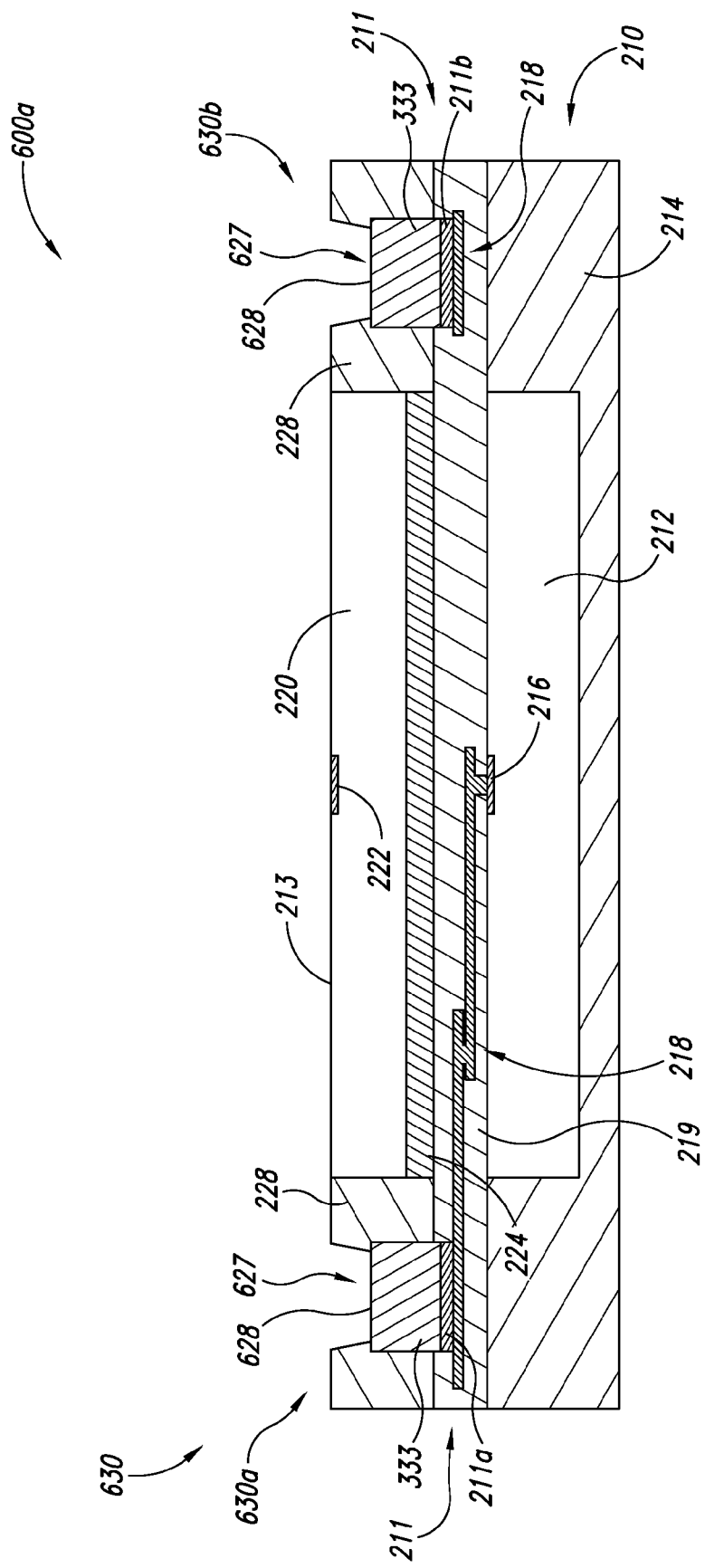
FIGS. 6B-6C are side cross-sectional views illustrating various stages in a method of forming semiconductor assemblies in accordance with an embodiment of the invention.
Figure 6C:
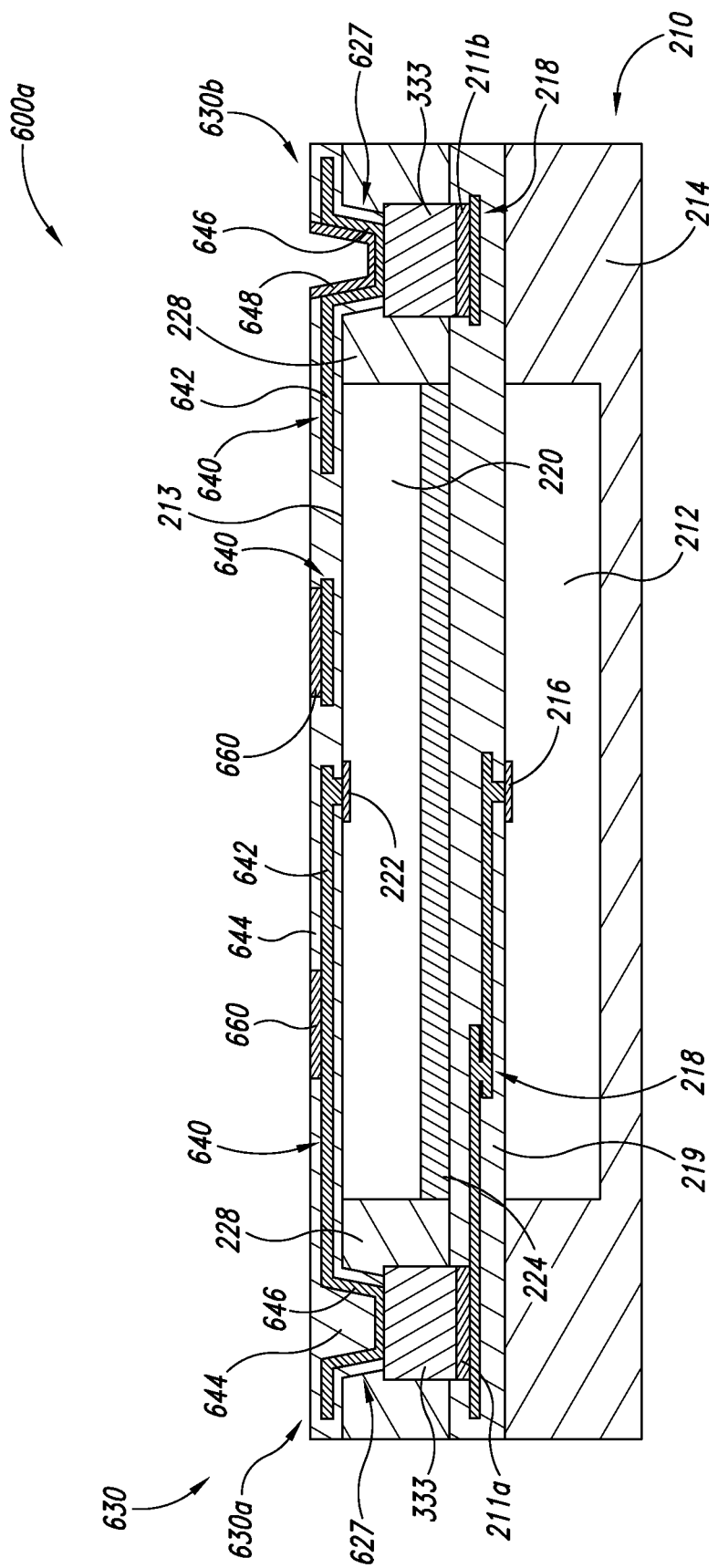

FIGS. 6B and 6C illustrate representative stages in a method of forming the assembly 600a and the interconnect structures 630 of FIG. 6A in accordance with one embodiment. FIG. 6B, more specifically, illustrates a stage at which the shallow vias 627 have been formed through the encapsulant 228 to expose the pedestals 333. The pedestals 333 are initially formed at the first bond-sites 211, as described above with reference to FIG. 3. The encapsulant 228 is then disposed over the pedestals 333 and around the attached die 220, and has an outer surface that is generally coplanar with an active side 213 of the attached die 220. The active side 213 of the attached die 220 carries the second bond-site 222 and is protected from being covered by the encapsulant 228. The shallow vias 627 are then formed through the encapsulant 228 and terminate at a surface 628 of the pedestals 333 spaced apart from the support member 210. In certain embodiments, the vias 627 can be formed by laser drilling or etching through the encapsulant 228 to the pedestals 333, and the vias 627 can have a depth that is less than a height of the pedestals 333. The presence of the pedestals 333 reduces the required depth of the vias 627 and can accordingly reduce or eliminate some of the challenges associated with forming, plating and filling vias having a high aspect ratio. Moreover, the pedestals 333 can reduce the likelihood of damage to the support member 210 or components beneath the pedestals 333 because the vias 627 terminate at the upwardly facing surface 628 of the pedestals 333.

FIG. 6C illustrates a stage at which the redistribution structure 640 has been formed proximate to the active side 213 of the die 220. The first interconnect structure 630a has a corresponding redistribution structure 640 that includes a conductive layer 642 extending into the shallow via 627 and coupled to the pedestal 333. The pedestal 333 provides a wide connection area for the portion 646 of the conductive layer 642 in the via 627 and a good thermal pathway away from the first bond-site 211a. A dielectric layer 644 is disposed on the conductive layer 642 to fill the remainder of the shallow via 627, protect the interconnect structure 630a, and/or electrically isolate the third bond-sites 660. The second interconnect structure 630b is generally similar to the first interconnect structure 630a, except that the conductive portion 646 in the shallow via 627 is not covered and filled with the dielectric layer 644. Rather, the conductive material 648 is disposed in the shallow via 627 to contact at least a portion of a conductive member 262 (e.g., a solder ball) illustrated in FIG. 6A.

Figure 6D:
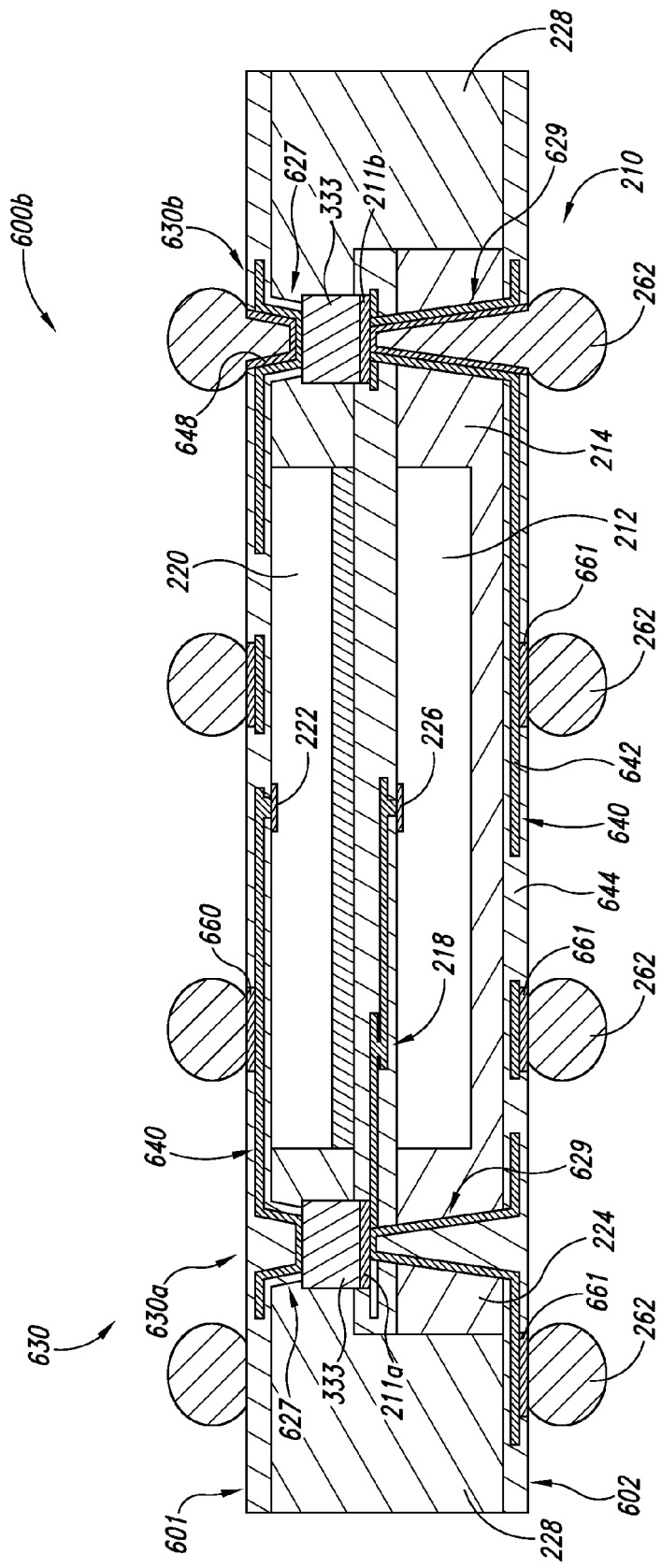
FIG. 6D is a side cross-sectional view of a semiconductor assembly in accordance with an embodiment of the invention.

FIG. 6D is a cross-sectional view of an assembly 600b configured in accordance with another embodiment of the invention. In this embodiment, the assembly 600b includes a first side 601 and an oppositely-facing second side 602, with interconnect structures 630 providing electrical access to the assembly 600b from both the first side 601 and the second side 602. For example, portions of the redistribution structure 640 toward the second side 602 include fourth bond-sites 661 that are accessible from the second side 602 of the assembly 600b and can be connected to corresponding conductive members 262 (e.g., solder balls). Accordingly, the assembly 600b can have a "double sided" configuration, suitable for stacking and/or inverted attachment arrangements. In this embodiment, the pedestals 333 and/or the first bond-sites 211a, 211b are accessed with vias 629 that extend through the packaging material 214 of the support member 210 from the second side 602 of the assembly 600b. The vias 629 can be formed and processed in a manner similar to that for the vias 627 described above to provide access and electrical connection to the pedestals 333.

Figure 7:
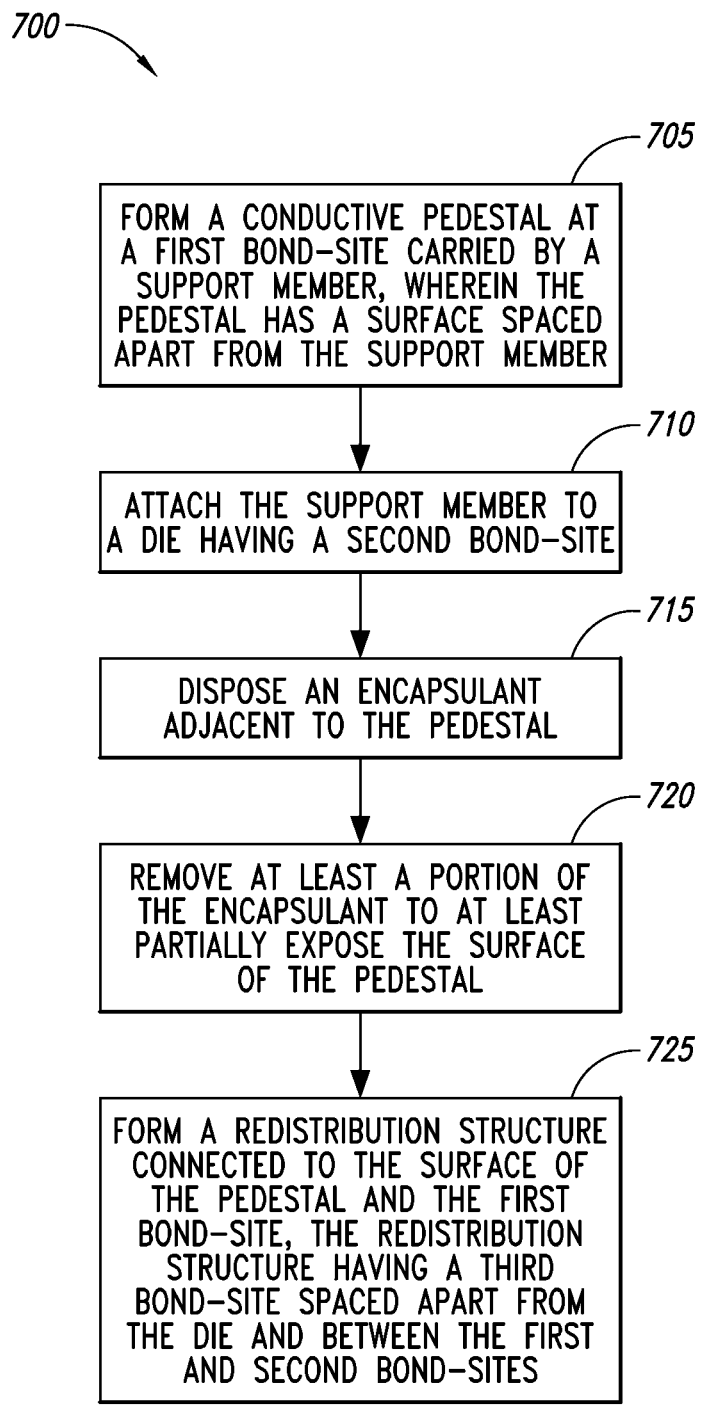
FIG. 7 is a flow diagram of a process for forming a semiconductor assembly in accordance with an embodiment of the invention.

FIG. 7 is flow diagram illustrating a process 700 for forming a semiconductor assembly in accordance with an embodiment generally similar to those described above with reference to FIGS. 6A-6D. In this embodiment, the process 700 includes forming a conductive pedestal at a first bond-site carried by a support member (block 705). The pedestal has a surface spaced apart from the support member, which can include a prepackaged die, a bare die, a layered substrate or other device that includes conductive and/or semiconductive features. The process further includes attaching the support member to a die having a second bond-site (block 710), disposing an encapsulant adjacent to the pedestal (block 715) and removing at least a portion of the encapsulant to at least partially expose the surface of the pedestal (block 720). In certain embodiments, removing at least a portion of the encapsulant includes forming a shallow via through the encapsulant and terminating the via at the surface of the pedestal. The via can be formed by drilling with a laser or other device, etching through the encapsulant, or another suitable method. The process further includes forming a redistribution structure connected to the surface of the pedestal and the first bond-site, the redistribution structure having a third bond-site spaced apart from the die between the first and second bond-sites (block 725). In certain embodiments, the process can further include coupling a conductive member to the exposed surface of the pedestal in the via.

Figure 8A:
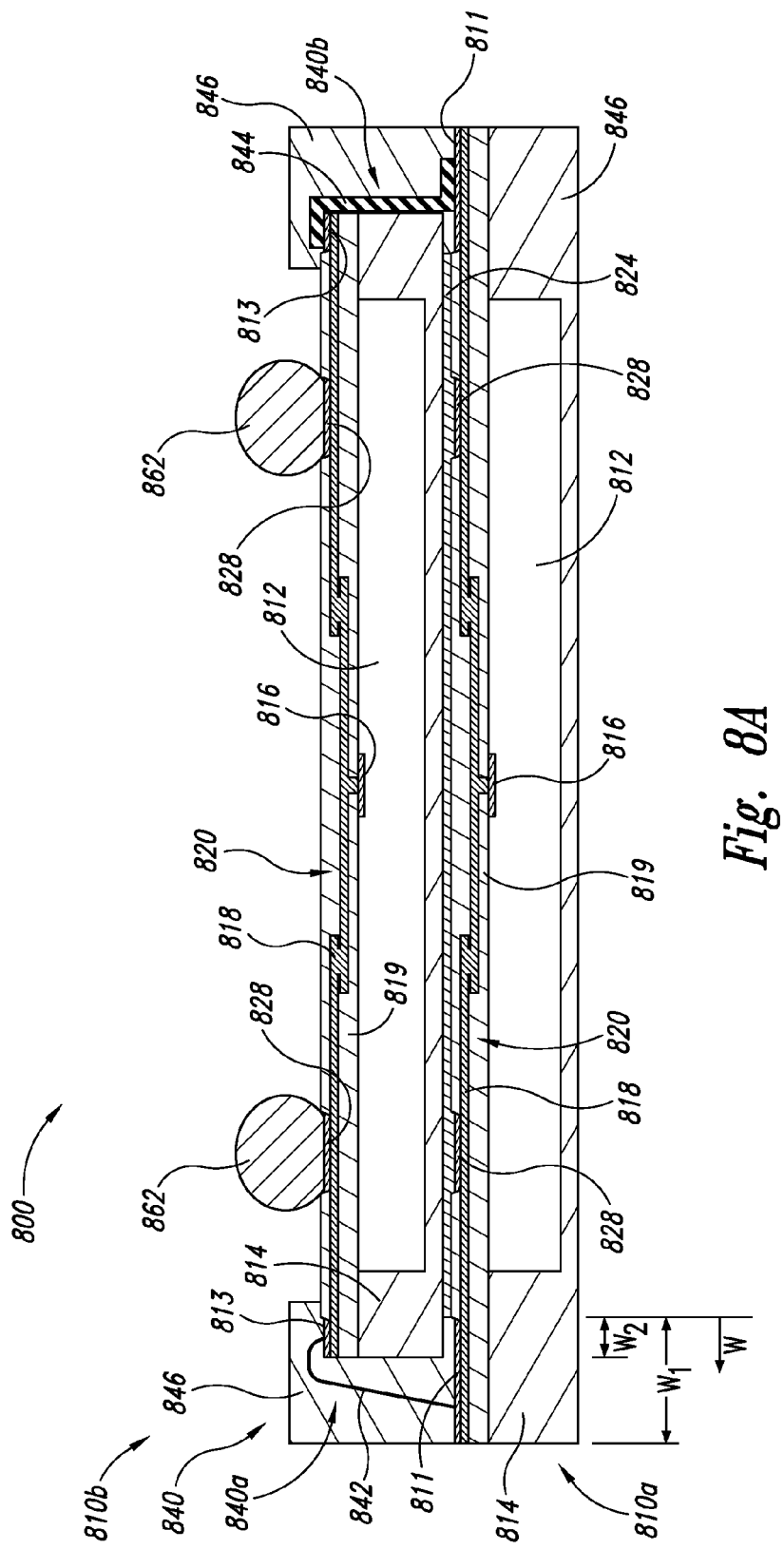
FIG. 8A is a side cross-sectional view of a semiconductor assembly in accordance with an embodiment of the invention.

FIG. 8A is a cross-sectional view of a semiconductor assembly 800 configured in accordance with another embodiment. The assembly 800 includes a first package 810a attached to a second package 810b, each of which is individually protected by a corresponding encapsulant 814. The first package 810a and the second package 810b each include a die 812 that is generally identical in size and configuration. The second package 810b is generally similar to the first package 810a, except that the second package 810b has a footprint that is smaller than a footprint of the first package 810a. For example, the first package 810*a* can include first bond-sites 811 at a periphery of the first package 810*a*, and the second package 810*b* can include second bond-sites 813 at a periphery of the second package 810*b*. The first bond-sites 811 and the second bond-sites 813 can have different widths W. For example, the width of the first bond-sites 811 can have a first value $W_1$, and the width of the second bond-sites 813 can have a second value $W_2$ that is less than the first value $W_1$. Accordingly, the footprint of the second package 810*b* can be smaller than the footprint of the first package 810*a*, and in the stacked configuration, the first bond-sites 811 overlap with the second bond-sites 813 along an axis transverse (e.g., perpendicular) to the first bond-sites 811 and the second bond-sites 813. In a particular embodiment, an inner edge of the first bond-sites 811 can be directly aligned under an inner edge of the second bond-sites 813, and an outer edge of the first bond-sites 811 can be laterally offset from an outer edge of the second bond-sites 813.

The dies 812 carried by the first package 810*a* and the second package 810*b* can be known good dies or other semiconductor devices that have been tested prior to assembly. Each die 812 also includes die bond-sites 816 that are coupled to the first bond-sites 811 and the second bond-sites 813 through corresponding redistribution structures 820. The individual redistribution structures 820 have features generally similar to the redistribution structures described above, e.g., including a conductive layer 818, a dielectric layer 819, and third bond-sites 828. Individual third bond-sites 828 of the second package 810*b* can be coupled to an external conductive member 862 (e.g., a solder ball) to provide an external connection to the assembly 800. Individual third bond-sites 828 of the first package 810*a* can be covered with an adhesive 824 that attaches the first and second packages 810*a*, 810*b* to each other.

The assembly 800 also includes interconnect structures 840 that electrically connect the first bond-sites 811 with the second bond-sites 813. For purposes of illustration and brevity, two different types of interconnect structures 840 (a first interconnect structure 840*a* and a second interconnect structure 840*b*) are shown in FIG. 8A on the same assembly 800. In many cases, individual assemblies 800 will include interconnect structures of one type or the other. The first interconnect structure 840*a* (shown on the left of FIG. 8A) can include a wire bond 842 that is coupled to the corresponding first bond-site 811 and the corresponding second bond-site 813. The wire bond 842 can be attached to the bond-sites 811, 813 using the wire bonding techniques described above, including for example wire bonding techniques such as stand-off stitch bonding. The order in which the bond-sites 811 and 813 are connected can differ. For example, the wire bond 842 can be attached to the first bond-sites 811 first, and then to the second bond-sites 813, or vice versa. The second interconnect structure 840*b* (shown on the right of FIG. 8A) can include a conformal conductive link 844 that is disposed on and between the corresponding first bond-site 811 and the corresponding second bond-site 813. The link 844 can be formed using deposition and etching techniques, or it can be formed by depositing a conformal conductive ink between the corresponding bond-sites.

After the interconnect structures 840 are coupled to the corresponding first bond-site 811 and the corresponding second bond-site 813, an encapsulant 846 is disposed around the interconnect structures 840 to at least partially encase the first bond-site 811 and the second bond-site 813 at the periphery of the assembly 800. By forming the interconnect structures 840 before disposing the encapsulant 846, the foregoing process can avoid some of the challenges described above associated with forming and filling interconnect vias in the encapsulant.

Figure 8B:
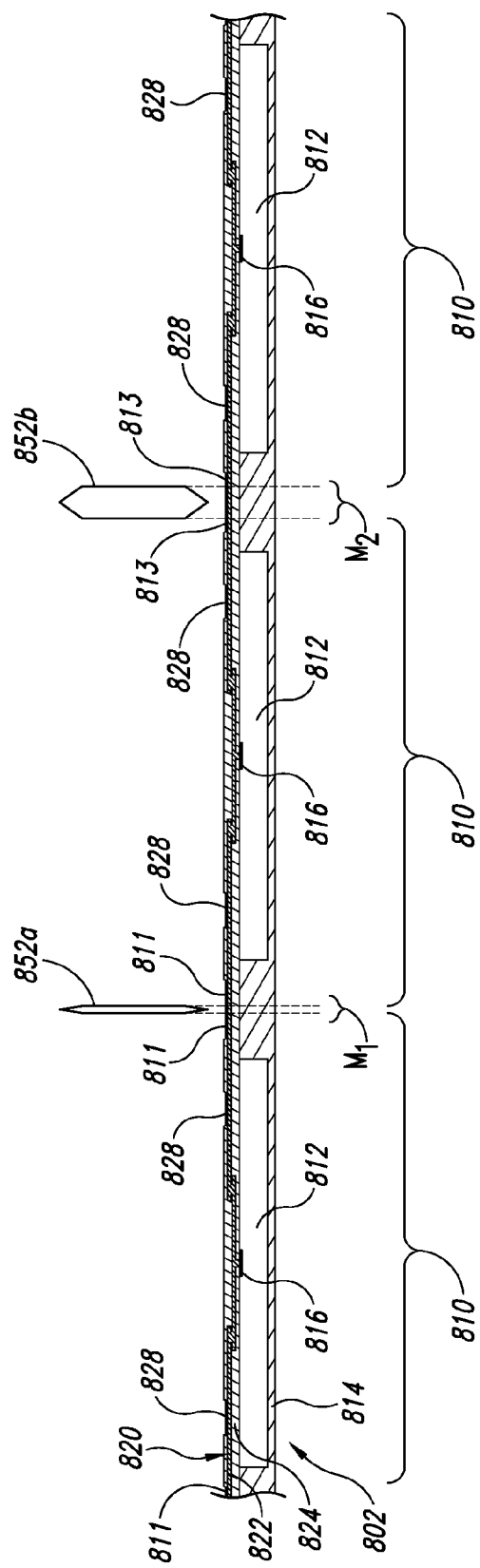
FIG. 8B is a side cross-sectional view illustrating a stage in a method of forming semiconductor assemblies in accordance with an embodiment of the invention.

FIG. 8B illustrates a stage in which the packages 810 are singulated so as to have the different sized footprints described above with reference to FIG. 8A. For the purposes of illustration, packages having different sized footprints are shown as being singulated from the same workpiece 802. One skilled in the art will appreciate that different sized packages may be singulated from corresponding different workpieces for increased production efficiency. The packages 810 can be singulated by cutting the workpiece 802 along singulation lines that intersect the first bond-sites 811 and the second bond-sites 813. Generally, the assemblies 810 can be singulated to make the second bond-sites 813 smaller than the first bond-sites 811, but in some cases the first bond-sites 811 may not be cut at all. In certain embodiments, the packages 810 can be singulated by dicing the workpiece 802 through the first bond-sites 811 and the second bond-sites 813 with cutting devices (e.g., wafer saws, blades, lasers, water jets, etc.) having different widths. For example, a first device 852*a* can have a first width that removes a first amount of material $M_1$, and a second device 852*b* can have a second width that removes a second amount of material $M_2$ that is greater than the first amount of material $M_1$. Accordingly, a package 810 that has been singulated with the first device 852*a* corresponds to the first package 810*a* shown in FIG. 8A, and a package 810 that has been singulated with the second device 852*b* corresponds to the second package 810*b* shown in FIG. 8A.

In other embodiments, a single cutting device 852 can singulate the packages 810 and remove the corresponding amounts of the first bond-sites 811 and the second bond-sites 813 by making multiple passes and repositioning the device 852 between passes. In still other embodiments, the assemblies 810 can be configured to include the first bond-sites 811 having the first width $W_1$ illustrated in FIG. 8A and the second bond-sites 813 having the second width $W_2$ illustrated in FIG. 8A, without cutting through the first bond-sites 811 or the second bond-sites 813 when singulating the assemblies 810.

FIG. 9 is a flow diagram of a process 900 for forming a semiconductor assembly generally similar to that shown in FIG. 8A. In this embodiment, the process 900 includes singulating a first assembly having a first die and a bond-site at a periphery of the first assembly (block 905). The process further includes singulating a second assembly having a second die generally identical to the first die and a second bond-site at a periphery of the second assembly, along a singulation line that intersects the second bond-site (block 910). Singulating the first and second assemblies includes separating the first and second assemblies from a parent structure (e.g., a wafer) at bond-sites such that the first assembly has as first footprint and the second assembly has a second footprint that is smaller than the first footprint. The method further includes attaching the first assembly to the second assembly (block 915) and connecting the bond-site of the first assembly to the bond-site of the second assembly with an interconnect structure (block 920). In certain embodiments, connecting corresponding bond-sites includes attaching a wire bond to the corresponding bond-sites. In other embodiments, connecting corresponding bond-sites includes disposing a conformal conductive link (e.g., conductive ink) between corresponding bond-sites. The method further includes encasing at least a portion of the interconnect structure and the bond-sites of the first and second assemblies with an encapsulant (block 925).

Any of the semiconductor assemblies having the interconnect structures described above with reference to FIGS. 1-9 can be incorporated into any of a myriad of larger and/or more complex systems, a representative example of which is system a 1000 shown schematically in FIG. 10. The system 1000 can include a processor 1002, a memory 1004 (e.g., SRAM, DRAM, flash and/or other memory devices), input/output devices 1006 and/or other subsystems or components 1008. Semiconductor assemblies having any one or combination of the interconnect structures described above with reference to FIGS. 1-9 may be included in any of the components shown in FIG. 10. The resulting system 1000 can perform any of a wide variety of computing, processing, storage, sensing, imaging and/or other functions. Accordingly, the representative system 1000 includes, without limitation, computers and/or other data processors, for example, desktop computers, laptop computers, Internet appliances, hand-held devices (e.g., palm-top computers, wearable computers, cellular or mobile phones, personal digital assistants, music players, etc.), multi-processor systems, processor-based or programmable consumer electronics, network computers and minicomputers. Other representative systems 1000 may be housed in a single unit or distributed over multiple interconnected units (e.g., through a communication network). The components of the system 1000 can accordingly include local and/or remote memory storage devices, and any of a wide variety of computer readable media.

From the foregoing, it will be appreciated that specific embodiments have been described herein for purposes of illustration, but that various modifications may be made without deviating from the invention. For example, one or more additional semiconductor devices may be stacked on the devices in any of the embodiments described above to form stacked devices including a greater number of stacked units. Furthermore, one or more additional semiconductor dies may be stacked on the dies in any of the semiconductor devices described above to form individual semiconductor devices having more than one die. For the purposes of illustration, many of the foregoing processes are shown in the context of an individual die; however, these processes can also be performed at the wafer level. The semiconductor devices may also include a number of other different features and/or arrangements. Aspects described in the context of particular embodiments may be combined or eliminated in other embodiments. Further, although advantages associated with certain embodiments have been described in the context of those embodiments, other embodiments may also exhibit such advantages, and not all embodiments need necessarily exhibit such advantages to fall within the scope of the invention. Accordingly, the invention is not limited except as by the appended claims.

We claim:

1. A method of forming a semiconductor assembly, comprising:
   attaching a support member having a first bond-site to a die having a second bond-site;
   attaching a wire to at least one of the first and second bond-sites;
   encasing at least a portion of the wire and the first and second bond-sites with an encapsulant; and
   coupling a third bond-site to an exposed segment of the wire extending outside of the encapsulant.

2. The method of claim 1, further comprising:
   forming a redistribution structure at a face of the encapsulant spaced apart from the die;
   connecting the redistribution structure to an intermediate segment of the wire between the first and second bond-sites; and
   forming the third bond-site at the redistribution structure.

3. The method of claim 1 wherein encasing at least a portion of the wire includes encasing the wire so that at least a portion of the wire is exposed from the encapsulant.

4. The method of claim 1, further comprising removing a portion of the encapsulant and exposing an intermediate segment of the wire.

5. The method of claim 1 wherein:
   attaching the wire includes attaching a continuous wire bond to the first and second bond-sites, the wire bond having an intermediate segment generally parallel to the die, and wherein the method further comprises:
      removing at least a portion of the encapsulant and at least a portion of the intermediate segment and exposing a first portion of the wire and a second portion of the wire separated from the first portion at a face of the encapsulant; and
      forming a redistribution structure at the face of the encapsulant and connected to the first and second portions of the wire, wherein the third bond-site is connected to the redistribution structure.

6. The method of claim 1 wherein attaching the wire includes attaching a continuous wire bond to the first and second bond-sites.

7. The method of claim 6 wherein coupling a third bond-site to the wire includes attaching the third bond-site directly to the wire bond.

8. The method of claim 1 wherein attaching the wire includes attaching a first stud bump to the first bond-site, and wherein the method further comprises attaching a second stud bump to the second bond-site.

9. The method of claim 1, further comprising simultaneously removing encapsulant and material from the wire to form the exposed segment of the wire.

10. The method of claim 1 wherein:
    attaching the wire comprises attaching the wire to the first and second bond-sites; and
    the method further comprises simultaneously removing encapsulant and material from the wire to remove an intermediate segment of the wire connecting the first and second bond-sites.

11. A method for manufacturing a semiconductor device, comprising:
    connecting a first end of a wire to a first bond-site on a semiconductor assembly;
    connecting a second end of the wire to a second bond-site on the semiconductor assembly;
    encasing at least a portion of the wire and the first and second bond-sites with an encapsulant; and
    removing the encapsulant to expose a portion of the wire through an outer face of the encapsulant, wherein the exposed portion of the wire projects beyond the outer face.

12. The method of claim 11, further comprising coupling an interconnect to the exposed portion of the wire.

13. The method of claim 11 wherein removing the encapsulant comprises planarizing the encapsulant to form the outer face.

* * * * *

UNITED STATES PATENT AND TRADEMARK OFFICE
CERTIFICATE OF CORRECTION

| | | |
|---|---|---|
| PATENT NO. | : 8,629,054 B2 | Page 1 of 1 |
| APPLICATION NO. | : 13/441533 | |
| DATED | : January 14, 2014 | |
| INVENTOR(S) | : Suan Jeung Boon et al. | |

It is certified that error appears in the above-identified patent and that said Letters Patent is hereby corrected as shown below:

On the Title Page, Item (12), delete "Jeung et al." and insert -- Boon et al. --.

On the Title Page, Item (75), under "Inventors", in column 1, lines 1-3, delete "Boon Suan Jeung, Singapore (SG);

Eng Meow Koon, Singapore (SG);

Chia Yong Poo, Singapore (SG)" and insert -- Suan Jeung Boon, Singapore (SG);

Meow Koon Eng, Singapore (SG);

Yong Poo Chia, Singapore (SG) --, therefor.

Signed and Sealed this
Nineteenth Day of August, 2014

Michelle K. Lee
*Deputy Director of the United States Patent and Trademark Office*